United States Patent
Olyunin et al.

(10) Patent No.: US 10,771,055 B2
(45) Date of Patent: Sep. 8, 2020

(54) SWITCHING DEVICE AND POWER CONVERSION DEVICE

(71) Applicant: SAMSUNG ELECTRONICS CO., LTD., Suwon-si (KR)

(72) Inventors: Nikolay Nikolayevich Olyunin, Perm (RU); Alexander Nikolayevich Khripkov, Lobnya (RU); Alexander Gennadyevich Chernokalov, Korolev (RU)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/321,096

(22) PCT Filed: Jul. 25, 2017

(86) PCT No.: PCT/KR2017/007998
§ 371 (c)(1),
(2) Date: Jan. 28, 2019

(87) PCT Pub. No.: WO2018/026133
PCT Pub. Date: Feb. 8, 2018

(65) Prior Publication Data
US 2019/0165779 A1 May 30, 2019

(30) Foreign Application Priority Data

Aug. 5, 2016 (RU) .............................. 2016132374
Mar. 29, 2017 (KR) ....................... 10-2017-0039944

(51) Int. Cl.
*H03K 17/687* (2006.01)
*H03K 17/10* (2006.01)
(Continued)

(52) U.S. Cl.
CPC ............ *H03K 17/687* (2013.01); *H02M 1/08* (2013.01); *H02M 3/335* (2013.01);
(Continued)

(58) Field of Classification Search
None
See application file for complete search history.

(56) References Cited

U.S. PATENT DOCUMENTS 6,060,937 A * 5/2000 Singer ................. H03K 17/063
327/390
6,483,369 B1 11/2002 Wittenbreder, Jr.
(Continued)

FOREIGN PATENT DOCUMENTS

EP 2 779 451 A1 9/2014
JP 2007-082351 A 3/2007
(Continued)

OTHER PUBLICATIONS

International Search Report (PCT/ISA/210), issued by International Searching Authority in corresponding International Application No. PCT/KR2017/007998, dated Nov. 20, 2017.
(Continued)

*Primary Examiner* — Lincoln D Donovan
*Assistant Examiner* — Khareem E Almo
(74) *Attorney, Agent, or Firm* — Sughrue Mion, PLLC

(57) ABSTRACT

Provided is a switching device including: a cascode switch including at least two transistors connected in series and receiving a switching control signal; and a third switch receiving the switching control signal, wherein the at least two transistors include a first transistor receiving the switching control signal through a control terminal and a second transistor having a control terminal connected to a first voltage source, and wherein the third switch is connected between the control terminal and the first terminal of the second transistor, is turned off when the first transistor is turned on, and is turned on when the first transistor is turned off.

15 Claims, 16 Drawing Sheets

(51) Int. Cl.
*H03K 17/0412* (2006.01)
*H02M 1/08* (2006.01)
*H02M 3/335* (2006.01)
*H03K 17/0416* (2006.01)
*H03K 17/06* (2006.01)
*H03K 17/081* (2006.01)
*H03K 17/0814* (2006.01)
*H02M 1/00* (2006.01)

(52) U.S. Cl.
CPC . *H03K 17/04123* (2013.01); *H03K 17/04163* (2013.01); *H03K 17/063* (2013.01); *H03K 17/08104* (2013.01); *H03K 17/08142* (2013.01); *H03K 17/102* (2013.01); *H02M 3/33538* (2013.01); *H02M 2001/0058* (2013.01)

(56) References Cited

U.S. PATENT DOCUMENTS

| | | | |
|---|---|---|---|
| 7,397,284 B1* | 7/2008 | Liu | H03K 5/2481 326/88 |
| 8,542,501 B2 | 9/2013 | Kyono | |
| 8,629,709 B2 | 1/2014 | Iraha et al. | |
| 8,779,841 B2 | 7/2014 | Ivankovic | |
| 8,878,593 B2 | 11/2014 | Koo et al. | |
| 2012/0176040 A1 | 7/2012 | Kamiya et al. | |
| 2012/0242375 A1* | 9/2012 | Takemae | H02M 3/155 327/109 |
| 2018/0076807 A1* | 3/2018 | Devarajan | H03K 19/01852 |
| 2019/0165779 A1* | 5/2019 | Olyunin | H02M 3/335 |

FOREIGN PATENT DOCUMENTS

| | | |
|---|---|---|
| KR | 10-2010-0125454 A | 11/2010 |
| KR | 10-2014-0053768 A | 5/2014 |
| RU | 2121751 C1 | 11/1998 |

OTHER PUBLICATIONS

Written Opinion (PCT/ISA/237) issued by the International Searching Authority in corresponding International Application No. PCT/KR2017/007998, dated Nov. 20, 2017.

Communication dated May 17, 2017, from the Russian Patent Office in counterpart application No. 2016132374/08.

Communication dated May 16, 2019, issued by the European Patent Office in counterpart European Application No. 17837185.2.

* cited by examiner

FIG. 10A

| SWITCHING DEVICE STRUCTURE | GaN EPC2012 Common source | Si IRF820 Common gate + Si D2089UK Common source (cascode) | IRF820 Common source |
|---|---|---|---|
| SWITCHING-ON TIME(Tfall) | ~3.2nS | ~4.5nS | ~8.0nS |
| COST | High | Low | Low |

FIG. 11

Estimation of the components volume:

| Component | Volume, mm³ |
|---|---|
| Current source inductor 1.5 uH | Φ20 x 12 = 3770 mm³ |
| Input filter inductor 0.7 uH | Φ20 x 10 = 3150 mm³ |
| Power transformer 1.2 uH | Φ20 x 8 = 2500 mm³ |
| Primary switching circuit | 10 x 10 x 2 = 200 mm³ |
| Rectifier circuit | 5 x 5 x 2 = 50 mm³ |
|  |  |
| Total volume: | < 100000 mm³ (6 in³) |
| Power density: | > 25 |

SWITCHING DEVICE AND POWER CONVERSION DEVICE

TECHNICAL FIELD

The present disclosure relates to a switching device and a power conversion device.

BACKGROUND ART

Semiconductor switching devices (switches, keys), such as diodes, thyristors, bipolar transistors, field effect transistors (MOSFETs) and the like, are widely used in various electronic devices. Semiconductor switching devices are used, for example, in power conversion systems, communication devices, control and monitoring devices, amplification devices, and the like. The semiconductor switching devices and the switching elements may control electric current by an on/off operation. Further, the performance of electronic devices may depend on the performance of the semiconductor switching devices used therein. The characteristics required for the semiconductor switching devices include high power efficiency, small size, high operation speed, low loss, high reliability and the like. Particularly, since the operating speed of the semiconductor switching devices affects the power efficiency and the operating frequency, semiconductor switching devices having a high switching speed are required.

DESCRIPTION OF EMBODIMENTS

Technical Problem

Provided is a high-frequency switching device having a high switching speed.

Further, provided is a switching device having a high power capacity and a low power loss.

Solution to Problem

According to an aspect of an embodiment of the present disclosure, there is provided is a switching device including: a cascode switch including at least two transistors connected in series and receiving a switching control signal; and a third switch receiving the switching control signal, wherein the at least two transistors include a first transistor receiving the switching control signal through a control terminal and a second transistor having a control terminal connected to a first voltage source, and wherein the third switch is connected between the control terminal and the first terminal of the second transistor, is turned off when the first transistor is turned on, and is turned on when the first transistor is turned off.

The cascode switch may be connected between a ground node and an output node, a first terminal of the first transistor may be connected to the ground node, and a second terminal of the second transistor may be connected to the output node.

Each of the first transistor, the second transistor, and the third switch may be a Metal Oxide Silicon Field Effect Transistor (MOSFET), the control terminal of the first transistor, the second transistor, and the third switch may be a gate of the MOSFET, and the first terminal of the second transistor may be a source of the MOSFET.

Each of the first transistor and the second transistor may be an N-type MOSFET, and the third switch may be a P-type MOSFET.

Each of the first transistor, the second transistor, and the third switch may be a bipolar transistor, the control terminal of the first transistor and the second transistor may be a base, and the first terminal of the second transistor may be an emitter.

Each of the first transistor and the second transistor may be an npn transistor, and the third switch may be a pnp transistor.

The cascode switch may include at least one transistor connected between a second terminal of the first transistor and the first terminal of the second transistor.

A power capacity of the second transistor may be greater than that of the first transistor, and a power capacity of the third switch may be smaller than that of the second transistor.

The switching device may further include a first diode having a cathode connected to the control terminal of the second transistor and an anode connected to a second terminal of the second transistor, and being connected with the third switch in parallel between the control terminal and the second terminal of the second transistor.

The switching control signal may be an alternating current (AC) signal and the output node may output an AC current synchronized with a frequency of the switching control signal.

The first voltage source may be a direct current (DC) voltage source having a voltage level lower than a high level voltage of the output node.

The switching control signal may have a frequency between 50 MHz and 60 MHz.

The cascode switch may be connected between the ground node and the output node, and the output node may output an AC current that varies between a high voltage level in the range of 100V to 350V and a ground node potential.

According to another aspect of an embodiment of the present disclosure, there is provided a power conversion device including the switching device according to the disclosed embodiments.

According to an embodiment, the power conversion device may include: a first AC-DC converter configured to receive a first AC current and convert the first AC current into a first DC current having a first voltage level; an inverter configured to convert the first DC output from the first AC-DC converter into a second AC current of a first frequency; a transformer configured to convert the second AC current output from the inverter into a third AC current having a second voltage level and outputting the third AC current; and a second AC-DC converter configured to convert the third AC current output from the transformer into a second DC current having a rated output voltage level, wherein the inverter includes the switching device and the switching device may receive the switching control signal of the first frequency.

The first DC current output from the first AC-DC converter may have a voltage level higher than that of the first AC current.

Advantageous Effects of Disclosure

According to the disclosed embodiments, a high-frequency switching device having a high switching speed may be provided.

In addition, according to the disclosed embodiments, a switching device having a high power capacity and a low power loss may be provided.

BRIEF DESCRIPTION OF DRAWINGS

FIG. 10A is a diagram illustrating response time and costs of a switching device according to a comparative example and an embodiment of the present disclosure.

FIG. 11 is a diagram illustrating an example of calculating the volume of a power conversion device according to an embodiment.

BEST MODE

Figure 1:
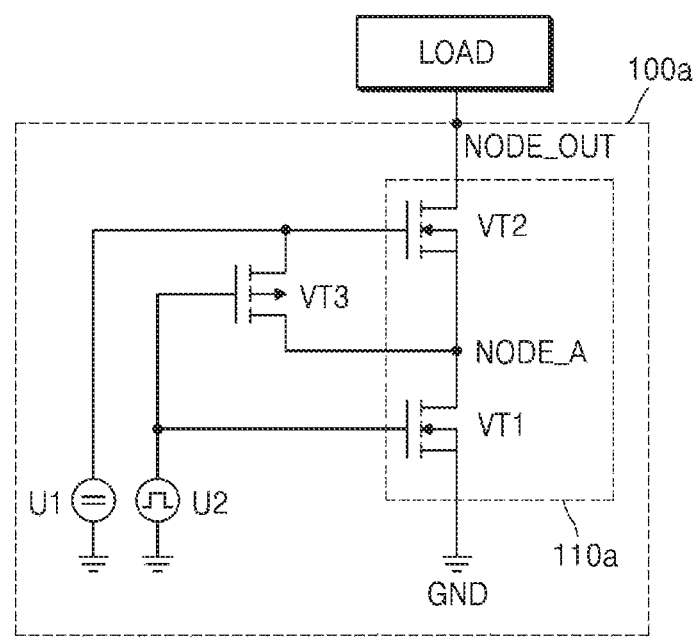
FIG. 1 is a diagram illustrating a structure of a switching device 100a according to an embodiment.

According to an aspect of the present disclosure, provided is a switching device including: a cascode switch including at least two transistors connected in series and receiving a switching control signal; and a third switch receiving the switching control signal, wherein the at least two transistors include a first transistor having the switching control signal input to a control terminal and a second transistor having a control terminal connected to a first voltage source, and wherein the third switch is connected between the control terminal and the first terminal of the second transistor, is turned off when the first transistor is turned on, and is turned on when the first transistor is turned off.

Mode of Disclosure

The present specification explains principles of the present disclosure and discloses embodiments to clarify the scope of the present disclosure and allow one of ordinary skill in the art to perform the present disclosure. The disclosed embodiments may be implemented in various forms.

Like reference numerals refer to like elements throughout the specification. This specification does not describe all the elements of the embodiments, and general contents in the technical field of the present disclosure and duplicative contents between embodiments will be omitted. As used herein, the term "module" or "unit" may be embodied in software, hardware or firmware, or a combination of two or more, and may be embodied as a plurality of "modules." Also, one "module" or "unit" may be configured to include a plurality of elements. Hereinafter, operation principles and embodiments of the present disclosure will be described with reference to the accompanying drawings.

Fast operating speed is one of the key requirements for switching devices. Since energy emitted from transistors of a switching device is lost as heat at the moment of switching, the high speed of the switching device is very important from the viewpoint of the efficiency of the device. Since the electric current flowing through the switching device in the turn-off state is close to 0 and the voltage applied to the switching device in the turn-on state is close to 0, the power emitted in the turn-off state and the turn-on state (the product of current and voltage) is close 0 and energy loss is small. However, since a state where both the current and the voltage of the switching device are not 0 may be generated at the moment of switching, considerable power may be consumed in the switching device. As long as the duration of the switching process is less than the time interval between switching operations, the average power consumption is relatively small. However, when the operating frequency of the switching device increases, the ratio of the switching process to the switching period may increase, the average power consumption may increase, and the power efficiency of the switching device may be reduced. To avoid such a situation, it may be appropriate to reduce the switching time to thereby increase the operating speed of the switching device.

One way to increase the operating speed of the switching device is to apply a cascode circuit which includes a main switching transistor which operates the gate at a fixed potential and is controlled from a source side and an auxiliary transistor which is controlled from the gate side and is connected in series with the main transistor. In this case, the main transistor may have a higher power capacity than the auxiliary transistor. For example, the main transistor may be a high power transistor and the auxiliary transistor may be a low power transistor. The state (for example, on or off) of such a switching device is determined by the state of the auxiliary transistor. Also, since the auxiliary transistor operates at a much lower drain-source voltage than the main transistor, the operating speed of the auxiliary transistor is much higher than the operating speed of the main transistor operating at relatively high power. Thus, the application of the cascode circuit enables the provision of a high speed switching device based on a general transistor.

A disadvantage of the cascode circuit, however, is a slow current turn-off process of the switching device, which is due to the passive turn-off of the main transistor. The main transistor is turned off by the interruption of the flow of the current passing through the auxiliary transistor, thereby delaying the turn-off process of the main transistor. In addition, the two transistors come to be in a non-conductive state due to the turn-off of the main transistor. Since the potential of the contacts of the two transistors remains undefined and floating, the voltage of the auxiliary transistor may exceed the maximum allowable voltage. To prevent this result, additional circuits such as diode Vz2 of U.S. Pat. No. 8,878,593 B2 (hereafter referred to as the "593 patent") may be used. When the diode Vz2 is turned on, the potential difference between the gate and the source of the main transistor M1 decreases, and the turn-off of the main transistor M1 may be accelerated. However, the diode Vz2 will be turned on when the potential N1 of the contacts of the transistors exceeds the potential of the gate of transistor M1, i.e., the turn-on process has already begun and skips a first stage (the turn-off the auxiliary transistor M2). Therefore, 593 Patent involves a high switching loss caused by the switching delay of the high power N-channel MOS transistor during the operation of the switching device described above.

U.S. Pat. No. 8,779,841 B2 (hereinafter referred to as the "841 patent") discloses a configuration of applying a more complicated supplementary circuit. The 841 patent discloses a cascode switch in which the first power transistor Q1 is located between the ground and the second transistor Q2, the second transistor Q2 is connected to the load, and the second transistor Q2 and the first power transistor Q1 are connected in series. The first power transistor Q1 is operable with an on/off switch responsive to a pulse source coupled to the gate of the first power transistor Q1. In addition, the 841 patent discloses a circuit further including a third transistor Q3. The additional bipolar transistor Q3 is opened when the control signal source voltage becomes zero and the auxiliary transistor Q1 is turned off. However, the method of accelerating the turn-off of the main transistor Q2 in the 841 patent has some disadvantages.

First, in order to open the additional transistor Q3, the potential of the base should be reduced after the voltage V1 of the control signal source is lowered. However, the base of the transistor Q3 may be connected to the control voltage source through the diode D4, and may be biased in the reverse direction at that moment to thereby allow the leakage current to be supplied as the control current to the base of the transistor Q3.

In addition, in the 841 patent, the potential of the gate of the main transistor Q2 may not be completely fixed but may be changed according to the applied control voltage V1. Moreover, the high charge capacity of the gate of the power transistor Q2 will require additional consumption of control signal power at the turn-on stage.

The speed reduction of the turn-off process of the main transistor Q2 of the 841 patent caused by the above-mentioned reasons causes additional power consumption and reduces the efficiency of the switching device. Moreover, this additional power consumption may be released as heat, causing a temperature rise of the device.

Thus, the solution of the 841 patent has disadvantages similar to those disclosed in the 593 patent. The switching loss caused by the switching delay of the high power N-channel MOS transistor Q2 is such that the high power N-channel MOS transistor Q2 starts the turn-off after the turn-off of the low power N-channel MOS transistor Q1 (the voltage of the Q1 drain should exceed a threshold) is finished. Furthermore, since the turn-off of the transistor Q1 is completed when the voltage of the drain of the transistor Q1 exceeds the threshold, it is difficult to avoid the delay of the turn-off operation of the transistor Q2.

Since the turn-on process of cascode circuits is generally much faster than the turn-off process and does not cause heat loss, the turn-on process has less impact on the switching performance than the turn-off process.

Also, high losses cause high heat emissions from the switching elements. Thus, there is a need to provide additional heat emitting elements, which increases the size of the device.

Further, improvement in the weight and size characteristics of the power supply (i.e., increase in specific power) reduces inductance and capacitance and reduces overall dimensions, which is closely related to increasing the operating frequency.

On the other hand, when the operating frequency of the switching device is increased, the limit speed of the switching elements becomes important because the switching device is accompanied by high energy emission (as heat) when the switching device is turned on from the turn-off state. When the switching occurs at a low frequency, the average emission power of the switching device is small, but when switching occurs frequently, the average emission power of the switching device may increase. In other words, the more frequent the switching, first, the less the efficiency of the switching device, because the more power is consumed, and second, as the heat released from the switching device increases, the more bulky heat sink is required, thereby preventing the reduction of the size of the power supply.

According to the disclosed embodiments, problems encountered in these comparative examples, such as high switching losses, performance degradation of the switching device due to switching delays of high power transistors, increase in the size of the switching device due to additional heat emitting elements, are resolved. That is, according to the disclosed embodiments, the power loss occurring during switching is significantly reduced and the performance degradation due to the switching delay of the high-power transistor is improved. In addition, the disclosed embodiments may reduce heat generation due to power loss, reduce the need for a heat sink, reduce the volume of the heat sink, and reduce the volume, inductance, and capacitance of the device.

FIG. 1 is a diagram illustrating a structure of a switching device 100a according to an embodiment.

The switching device 100a according to one embodiment includes at least two serially connected transistors VT1 and VT2, and a third switch VT3. At least two serially connected transistors VT1 and VT2 may be connected in series between a ground node GND and an output node NODE_OUT, a control terminal of the first transistor VT1 may be connected to a control signal source U2 outputting a switching control signal, and a control terminal of the second transistor VT2 may be connected to a first voltage source U1, which is a cascode switch structure. According to one embodiment, the first transistor VT1 may be a low-power transistor and the second transistor VT2 may be a high-power transistor having a higher power capacity than the first transistor VT1. Accordingly, the first transistor VT1 may have a lower capacitance and a faster switching speed than the second transistor VT2. A second terminal of the second transistor VT2 may be connected to the output node NODE_OUT. The first transistor VT1 may be connected between a first terminal of the second transistor VT2 and the ground node GND. According to one embodiment, at least one transistor may be further connected in series between the first transistor VT1 and the second transistor VT2, or at least one transistor may be additionally connected in series between the first transistor VT1 and the ground node.

The output node NODE_OUT may be a node connected to a predetermined load. The switching device 100a according to the disclosed embodiments may change the current applied from the load. For example, the switching device 100a may convert a direct current applied from the load to an alternating current of a predetermined frequency. As another example, the switching device 100a may output a control signal or a data signal of a predetermined waveform by modulating an input signal. The waveform of the output node NODE_OUT may be determined by the voltage level applied from the load LOAD and the frequency or waveform of the switching control signal.

The third switch VT3 may be connected between the control terminal of the second transistor VT2 and the first terminal of the second transistor VT2. The control terminal of the third switch VT3 may be connected to the control signal source U2 to thereby receive the switching control signal. That is, the control terminal of the third switch VT3 and the control terminal of the first transistor VT1 may receive the same switching control signal. Further, the second terminal of the third switch VT3 is connected to the control terminal of the second transistor VT2 to thereby be connected to the first voltage source U1.

According to another embodiment, the third switch VT3 may receive a second switching control signal having the same frequency as the switching control signal and being synchronized at the same timing.

The third switch VT3 is a switching element that is turned off when the first transistor VT1 is turned on and is turned on when the first transistor VT1 is turned off. According to one embodiment, the third switch VT3 may be a transistor having a polarity opposite to that of the first transistor VT1. Also, according to one embodiment, the third switch VT3 may be a low-capacity switch and may have a smaller power capacity than the second transistor VT2.

The first voltage source U1 may be a direct current (DC) power source having a voltage level lower than the highest voltage level of the output node NODE_OUT and having a voltage level higher than a threshold voltage for turning on the second transistor VT2.

According to one embodiment, the control signal source U2 is an alternating current (AC) signal source having a predetermined frequency and may output an AC signal having a voltage higher than the threshold voltage for turning on the first transistor VT1.

According to another embodiment, the control signal source U2 is an AC signal source having a predetermined waveform for signal modulation and may output an AC signal having a voltage higher than the threshold voltage for turning on the first transistor VT1.

The present disclosure will be explained centering on an embodiment in which the first transistor VT1 and the second transistor VT2 are N-type MOSFETs, and the third switch VT3 is a P-type MOSFET. However, this is an exemplary embodiment, and the first transistor VT1, the second transistor VT2, and the third switch VT3 may be implemented by using various kinds of elements, and the scope of claims is not limited by the kinds of the elements.

The gate terminal of the third switch VT3 and the gate terminal of the first transistor VT1 may be connected to the control signal source U2. Therefore, since the first transistor VT1 and the third switch VT3 are controlled by the same voltage source, the third switch VT3 may operate simultaneously with the first transistor VT1. That is, the switching operation of the first transistor VT1 and the third switch VT3 may be performed simultaneously.

The drain of the third switch VT3 is connected to the gate terminal of the second transistor VT2 and the source of the third switch VT3 is connected to the source of the second transistor VT2. The third switch VT3 is connected between the gate and the source of the second transistor VT2 to thereby accelerate the turn-off operation of the second transistor VT2 by providing a current path. Specifically, when the switching control signal is switched to a low level and a cascode switch 110a is turned off, the third switch VT3 is turned on. As such, the third switch VT3 generates a current path between the gate and the source of the second transistor VT2 to thereby rapidly lower the Vgs of the second transistor VT2 and accelerate the turn-off operation of the second transistor VT2.

The gate terminal of the second transistor VT2 may be connected to the first voltage source U1, and the drain of the second transistor VT2 may be connected to the load LOAD. The drain of the first transistor VT1 may be connected to the source of the second transistor VT2, and the source of the first transistor VT1 may be connected to the ground node GND.

Next, the switching-on operation of the switching device 100a will be described.

The state of the first transistor VT1 is changed from the turn-off state to the turn-on state at the rising edge of the switching control signal. The gate of the third switch VT3 is directly connected to the gate of the first transistor VT1, but since the third switch VT3 has a polarity opposite to that of the first transistor VT1, the third switch VT3 is turned off at the rising edge. That is, when the first transistor VT1 is turned on, the third switch VT3 is turned off. Since the source of the third switch VT3 is connected to the gate of the second transistor VT2 and the drain of the third switch VT3 is connected to the source of the second transistor VT2, when the third switch VT3 is at the turn-off state, the switching device 100a operates as a turn-on cascode switch that provides a low resistance. Since the node A NODE_A is connected to the ground node GND through the first transistor VT1, it has a ground potential or a potential close to the ground potential. Also, as the gate-source voltage of the second transistor VT2 comes to have almost the same value as the voltage of the first voltage source U1, the second transistor VT2 is turned on.

Next, the switching-off operation of the switching device 100a will be described.

The state of the first transistor VT1 is changed from the turn-on state to the turn-off state at the falling edge of the switching control signal. At the same time, the third switch VT3 is turned on since the gate thereof is directly connected to the gate of the first transistor VT1 and has a polarity opposite to that of the first transistor VT1. When the third switch VT3 is turned on, the node A NODE_A is connected to the first voltage source U1 via the third switch VT3 to thereby have the potential of the first voltage source U1 or a potential close to the potential of the first voltage source U1. Further, since the gate and the source of the second transistor VT2 have almost the same potential as the third switch VT3 is turned on, the gate-source voltage of the second transistor VT2 becomes nearly zero, and the second transistor VT2 is turned off.

The second transistor VT2 may be implemented as a high capacity transistor having a high power capacity. Particularly, when the cascode switch 110a is used in the power conversion device, a high power capacity is required for the second transistor VT2. However, transistors with high power capacities have a slow turn-off switching speed because they have high capacitance. Further, when the turn-off switching speed is slowed down, the power loss occurring at the time of turn-off is increased and the heat emission is increased. Therefore, according to the present embodiment, when the cascode switch 110a is switched to the turn-off state, a current path is generated by the third switch VT3 between the gate and the source of the second transistor VT2, which increases the speed at which the gate-source voltage of the second transistor VT2 drops, thereby improving the speed of the turn-off operation of the second transistor VT2 and reducing the power loss and heat emission.

Further, in the cascode switch structure without the third switch VT3, when the cascode switch is turned off, the first transistor VT1 and the second transistor VT2 are turned off to thereby have high impedance, and the potential of the node A NODE_A remains in an undefined floating state. According to the disclosed embodiments, when the cascode switch is turned off, the node A NODE_A has the same potential as that of the first voltage source U1 and is not left in the floating state.

Figure 2:
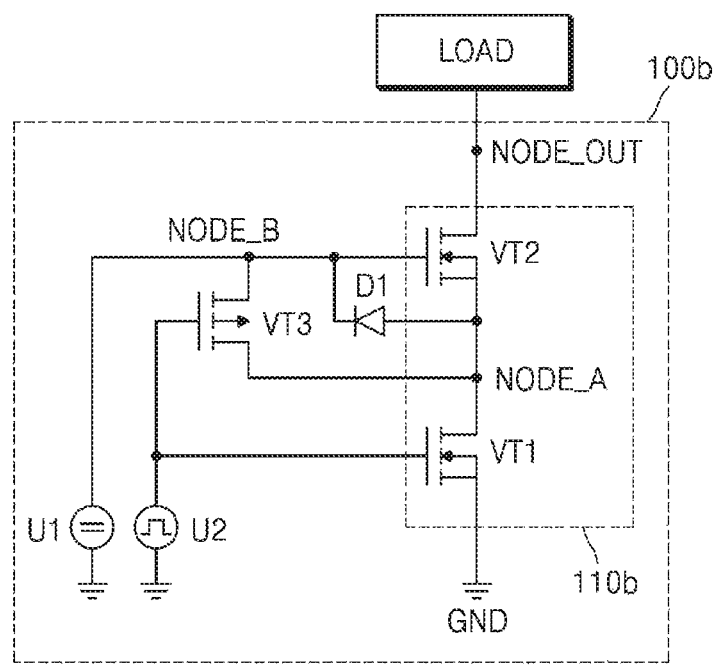
FIG. 2 is a diagram illustrating a structure of a switching device 100b according to an embodiment.

FIG. 2 is a diagram illustrating a structure of a switching device 100b according to an embodiment.

The switching device 100b according to one embodiment may include at least two transistors VT1 and VT2 connected in series, a third switch VT3, and a first diode D1.

The first diode D1 protects the third switch VT3 when the switching speed of the third switch VT3 becomes lower than the switching speed of the first transistor VT1. P-type MOSFETs generally have a slower switching speed than N-type MOSFETs. Therefore, when the third switch VT3 is implemented by the P-type MOSFET, the switching speed of the third switch VT3 may be slower than that of the first transistor VT1. This allows the potential of the node A NODE_A, which is the contact point of the first transistor VT1 and the second transistor VT2, to be higher than the potential of a node B NODE_B, which is the source of the third switch VT3, and such a polarity may not be allowed when the third switch VT3 is a P-type transistor. Therefore, the first diode D1 prevents the erroneous polarity voltage from being applied to the third switch VT3. That is, when the potential of the node A NODE_A becomes higher than the potential of the node B NODE_B, the first diode D1 generates a current path between the node A NODE_A and the node B NODE_B to thereby drop the potential of the node A NODE_A to the potential of the node B NODE_B.

According to another embodiment, the first transistor VT1, the second transistor VT2, and the third switch VT3 may be implemented as bipolar transistors. Such bipolar transistors may have the same or similar structure as the circuit structure of the embodiment implemented as a MOSFET transistor. When a bipolar transistor is used, an n-p-n transistor is used instead of an n-type MOSFET, and a p-n-p transistor is used instead of a p-type MOSFET.

Figure 3:
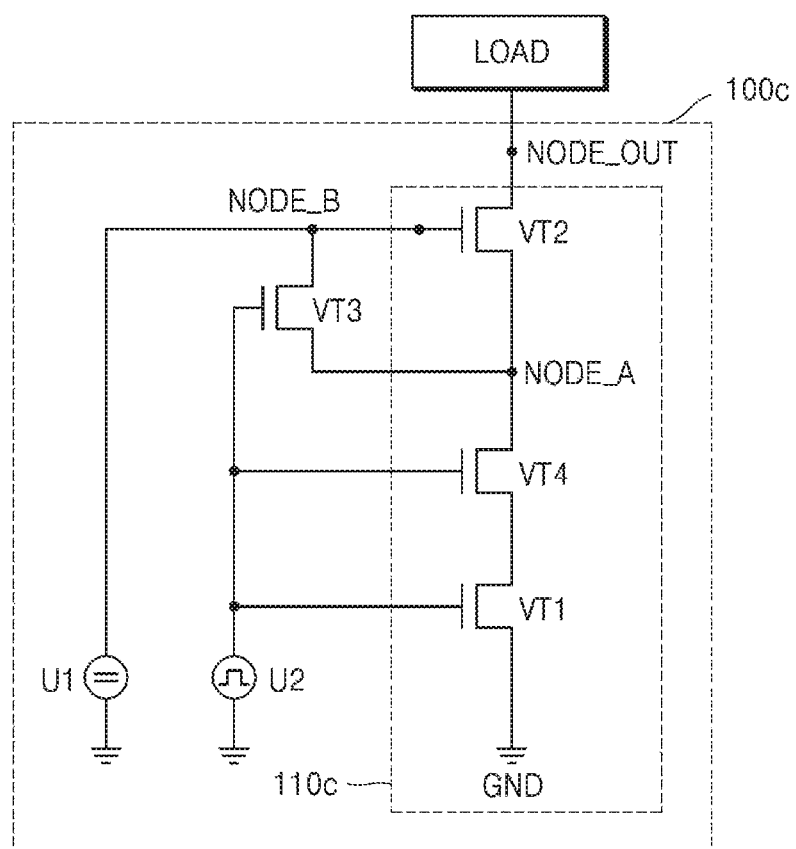
FIG. 3 is a diagram illustrating a structure of a switching device 100c according to an embodiment.

FIG. 3 is a diagram illustrating a structure of a switching device 100c according to an embodiment.

According to one embodiment, a cascode switch 110c may be implemented in such a manner that three or more transistors VT1, VT2, and VT4 are connected in series between the ground node GND and the output node NODE_OUT. For example, as shown in FIG. 3, a first transistor VT1, a fourth transistor VT4, and a second transistor VT2 may be connected in series between a ground node GND and an output node NODE_OUT. The fourth transistor VT4 may be implemented as a transistor having the same polarity as that of the first transistor VT1 and the second transistor VT2, for example, may be implemented as an N-type MOSFET. The control terminal of the fourth transistor VT4 may be connected to the control signal source U2. The fourth transistor VT4 may be a low-capacitance transistor having a lower power capacity than the second transistor VT2.

When a transistor is added to the cascode switch 110c, a transistor may be added between the fourth transistor VT4 and the first transistor VT1, and the control terminal of the added transistor may be connected to the control signal source U2.

Figure 4:
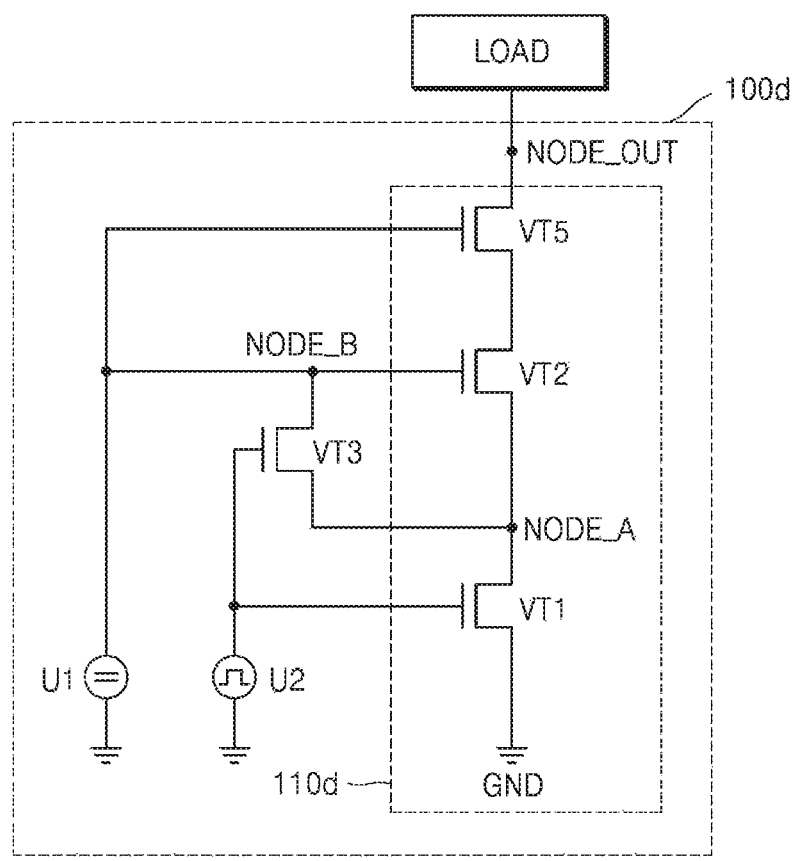
FIG. 4 is a diagram illustrating a structure of a switching device 100d according to an embodiment.

FIG. 4 is a diagram illustrating a structure of a switching device 100d according to an embodiment.

According to one embodiment, a cascode switch 110d may be implemented in such a manner that three or more transistors VT1, VT2, and VT5 are connected in series between the ground node GND and the output node NODE_OUT. For example, as shown in FIG. 4, a first transistor VT1, a second transistor VT2, and a fifth transistor VT5 may be connected in series between a ground node GND and an output node NODE_OUT. The fifth transistor VT5 may be implemented as a transistor having the same polarity as that of the first transistor VT1 and the second transistor VT2, for example, may be implemented as an N-type MOSFET. The control terminal of the fifth transistor VT5 may be connected to the first voltage source U1. The fifth transistor VT5 may be a high capacity transistor having a higher power capacity than the first transistor VT1.

When a transistor is added to the cascode switch 110d, a transistor may be added between the fifth transistor VT5 and the second transistor VT2, and the control terminal of the added transistor may be connected to the first voltage source U1.

According to one embodiment, the cascode switch 110d may further include at least one transistor, which is connected in series between the second transistor VT2 and the fifth transistor VT5 and has a control terminal connected to the first voltage source U1, and at least one transistor, which is connected in series between the ground node GND and the first transistor VT1 and has the control terminal connected to the control signal source U2.

Figure 5:
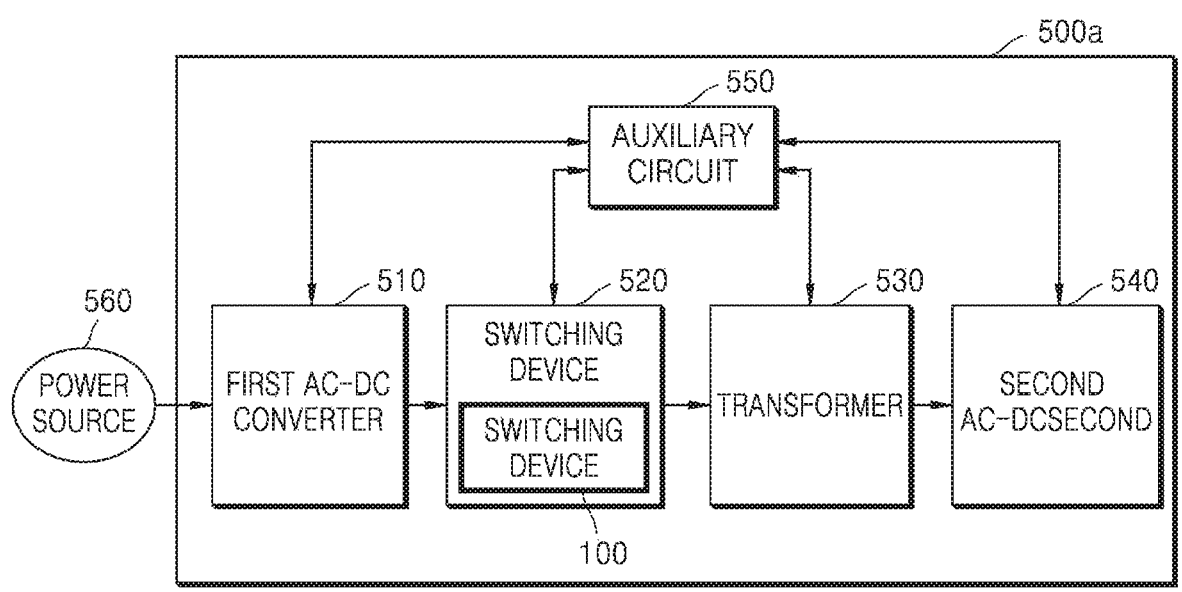
FIG. 5 is a diagram illustrating a structure of a power conversion device 500a according to an embodiment.

FIG. 5 is a diagram illustrating a structure of a power conversion device 500a according to an embodiment.

A power conversion device 500a according to one embodiment includes a first AC-DC converter 510, an inverter 520, a transformer 530, and a second AC-DC converter 540. The inverter 520 may include the switching device 100 according to any of the previously disclosed embodiments.

The power conversion device 500a is provided in an adapter for an electronic device or a main body of the electronic device, and may convert power supplied from the outside into a voltage level and a current size corresponding to the rated input of the electronic device. The electronic device may be, for example, a communication terminal, a laptop computer, a tablet PC, a wearable device, or the like.

The power conversion device 500a receives a first AC current from a power source 560 and outputs a DC current corresponding to the voltage level of the rated output. The power source 560 may be a power grid. The power source 560 may supply, for example, AC power of 220V and 50 Hz AC power, or AC power of 110V and 50 Hz to 60 Hz. The power conversion device 500a according to the disclosed embodiments may support both 220V input power and 110V input power.

The first AC-DC converter 510 converts an input AC current, which is input from the power source 560, into a DC current of a first voltage level and outputs the DC current to the inverter 520. The first AC-DC converter 510 may have a rectifier structure. The first voltage level is a voltage higher than the input AC voltage, and may be, for example, a voltage level ranging from 300V to 400V. According to one embodiment, the first AC-DC converter 510 may be implemented by substitution of electrolytic capacitors by ceramic capacitors.

The inverter 520 converts the high voltage DC into a high voltage AC having a high frequency (0.01 to 50 MHz) and outputs the high voltage AC to the transformer 530. The inverter 520 requires a switching device 100 that supports a fast switching operation to increase the AC frequency. The switching device 100 may have a switching structure, may include a gate driver, and may need isolation of a serial switch structure. The inverter 520 of the power conversion device 500a of the present disclosure may support high frequency and reduce the leakage current by employing one of the switching devices 100a, 100b, and 100c according to the above-described embodiments.

The transformer 530 converts a high-voltage high-frequency AC output from the inverter 520 to a required low-voltage AC (for example, 5V) and outputs the low-voltage AC to the second AC-DC converter 540. The mechanical and electrical structure of the transformer 530 may be varied and optimized for the efficiency of the transformer 530. In addition, the size and weight of the transformer 530 decreases as the frequency increases. According to the disclosed embodiments, a high frequency AC may be output to the transformer 530 by using the switching device 100 that supports a high switching speed in the inverter 520, thereby reducing the size and weight of the transformer 530.

The second AC-DC converter 540 converts the high-frequency low-voltage AC output from the transformer 530 to a DC having a required voltage level and outputs the DC as an output of the power conversion device 500a. The second AC-DC converter 540 may have a rectifier structure. For example, the second AC-DC converter 540 may output a DC converted to 5V, which is the rated output voltage level of the power conversion device 500a.

An auxiliary circuit 550 is for improving the performance of the power conversion device 500a and may include at least one of, for example, a supply circuit, a feedback circuit, and a protection circuit or a combination thereof.

Figure 6:
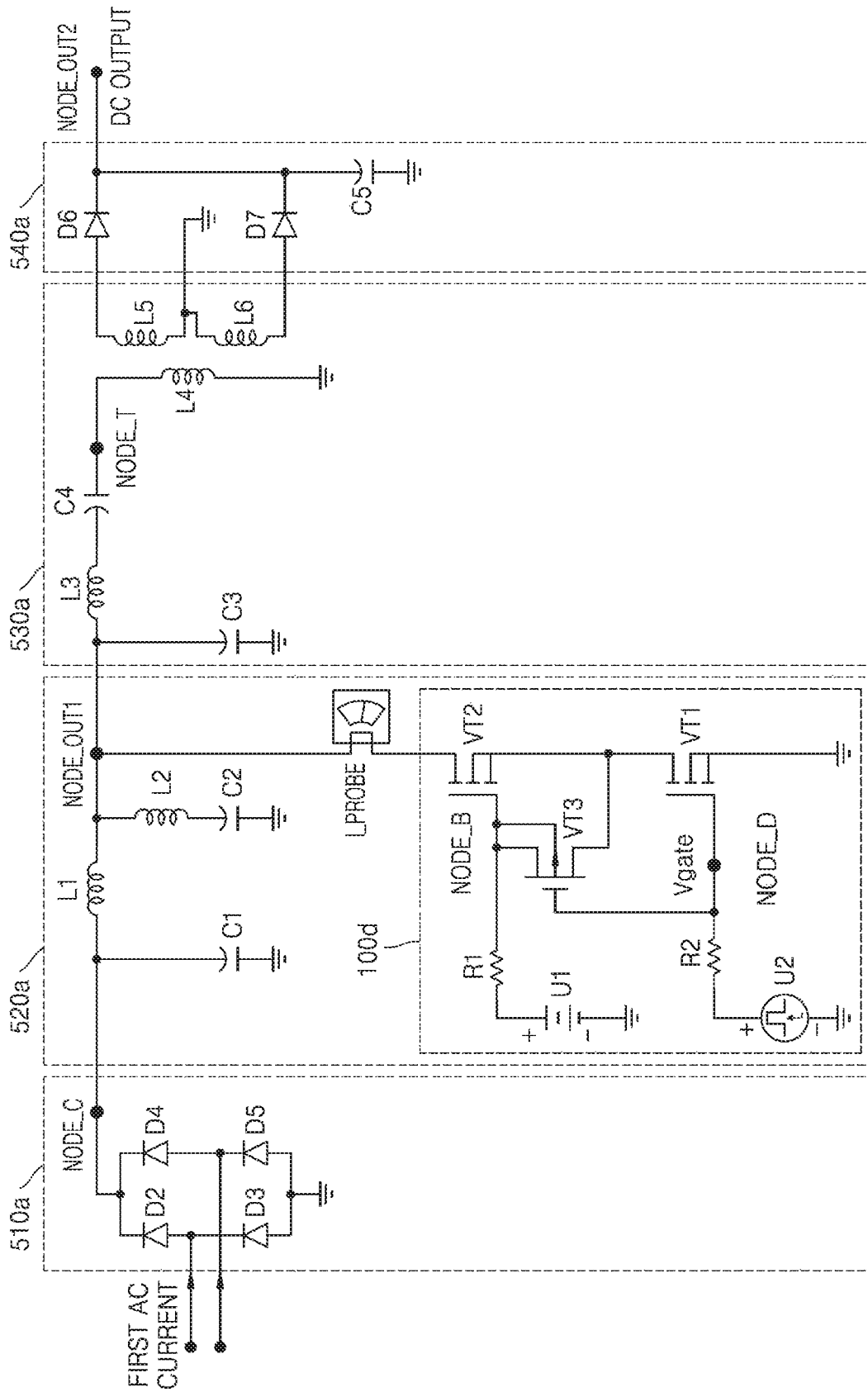
FIG. 6 is a diagram illustrating a structure of a power conversion device 500a according to an embodiment.

FIG. 6 is a diagram illustrating a structure of a power conversion device 500a according to an embodiment.

A first AC-DC converter 510a may be implemented in the form of a rectifier circuit implemented with four diodes D2, D3, D4, and D5, as shown in FIG. 6. According to the present embodiment, the second diode D2 and the third diode D3 are connected in series between the node C NODE_C and the ground node, and the fourth diode D4 and the fifth diode D5 are connected in series between the node C NODE_C and the ground node. A first circuit composed of the second diode D2 and the third diode D3 and the second circuit composed of the fourth diode D4 and the fifth diode D5 may be arranged in parallel between the node C NODE_C and the ground node. The first AC current supplied from the power source 560 may be input to the node between the second diode D2 and the third diode D3 and the node between the fourth diode D4 and the fifth diode D5, respectively. The first AC current input to the first AC-DC converter 510a is stepped up to a voltage higher than the input voltage, is converted to a DC to thereby be output to an inverter 520a through the node C NODE_C.

The inverter 520a may have a circuit structure for filtering the input current. The inverter 520a according to the present embodiment may include a first capacitor C1 connected between the ground node and the node C NODE_C, a first inductor L1 connected between the node C NODE_C and a first output node NODE_OUT1, and a second inductor L2 and a second capacitor C2 connected in series between the first output node NODE_OUT1 and the ground node.

The switching device 100d may be connected between the first output node NODE_OUT1 and the ground node. A predetermined auxiliary circuit I_PROBE may be added between the first output node NODE_OUT1 and the switching device 100d.

The switching device 100d may include a first transistor VT1, a second transistor VT2, and a third switch VT3. According to one embodiment, a first resistor R1 may be added between the first voltage source U1 and the node B NODE_B, and a second resistor R2 may be added between the control signal source U2 and the node D.

According to another embodiment, the switching device 100d may be replaced by the switching devices 100a, 100b, and 100c according to the above-described embodiments.

A transformer 530a may include a third capacitor C3 connected between the first output node NODE_OUT1 and the ground node, a third inductor L3 and a fourth capacitor C4 connected in series between the first output node NODE_OUT1 and a node T NODE_T, a fourth inductor L4 connected between the node T NODE_T and the ground node, and a fifth inductor L5 and a sixth inductor L6 arranged adjacent to the fourth inductor L4. The transformer 530a converts a high voltage AC current output from the first output node NODE_OUT1 of inverter 520a to a low voltage AC.

A second AC-DC converter 540a may include a sixth diode D6 connected in series between the fifth inductor L5 and a second output node NODE_OUT2, a seventh diode D7 connected in series between the sixth inductor L6 and the second output node NODE_OUT2, and a fifth capacitor C5 connected between the second output node NODE_OUT2 and the ground node. The second AC-DC converter 540a converts the AC current output from the transformer 530a into a DC current having a voltage level corresponding to the rated output, and outputs the DC current to the second output node NODE_OUT2.

In the embodiment shown in FIG. 6, IRFBG 30 and IRFBG 2060 IR transistors may be provided in circuits, the rectifier may have a diode model with a forward voltage of 0.25 V and a zero capacitance and may have a frequency of 6.5 MHz and an output power of 160.8 W.

Figure 7A:
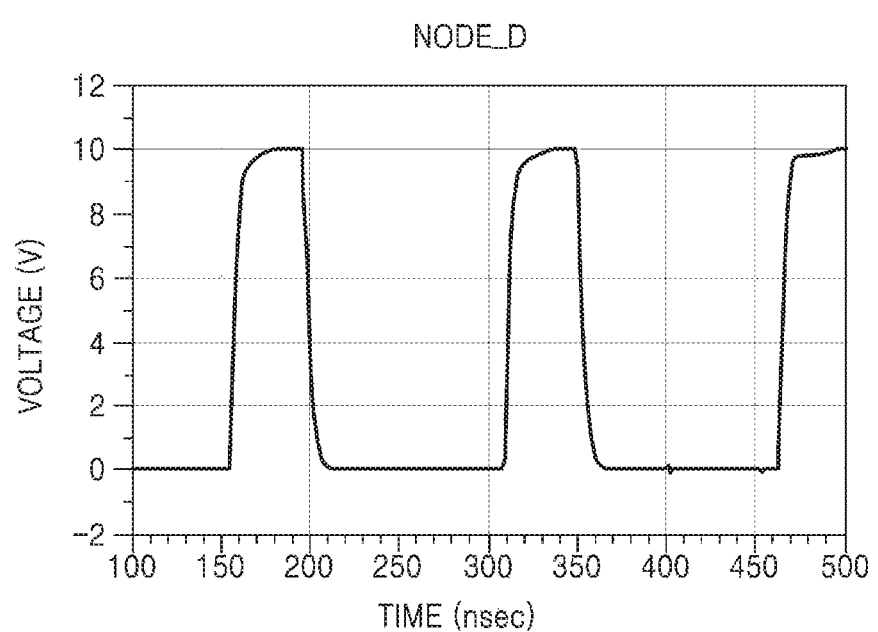
FIGS. 7A to 7C are diagrams illustrating voltage levels of respective nodes of the power conversion device 500a according to an embodiment.
Figure 7B:
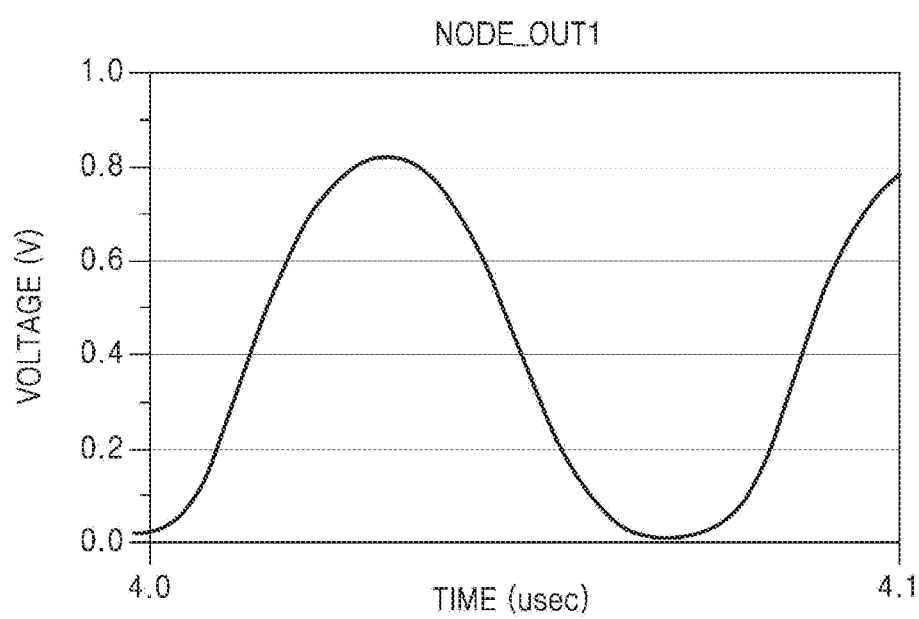
Figure 7C:
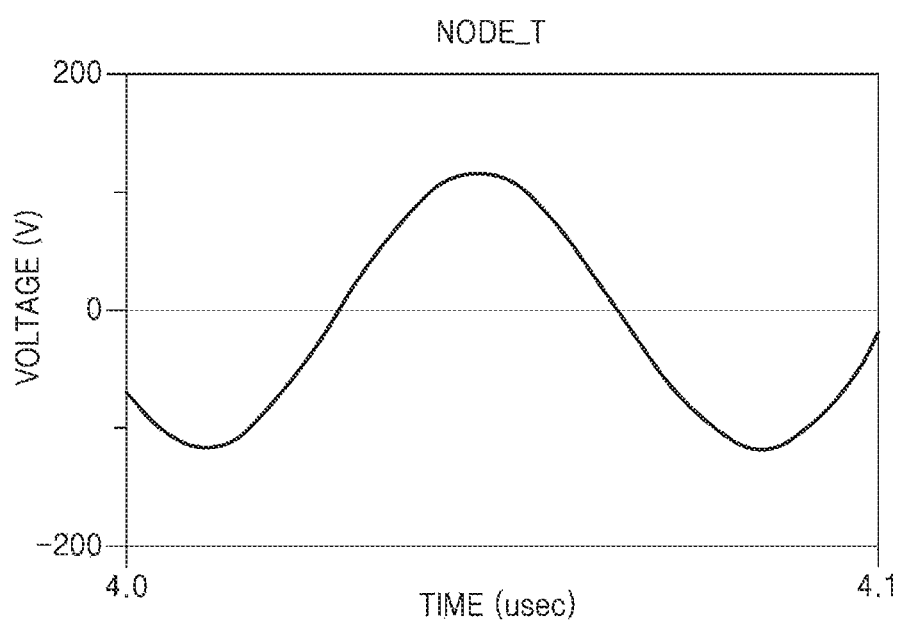

FIGS. 7A to 7C are diagrams illustrating voltage levels of respective nodes of the power conversion device 500a according to an embodiment.

FIG. 7A shows the voltage level of node D NODE_D in FIG. 6. The horizontal axis of the graph of FIG. 7A represents the time in nano second units, and the vertical axis represents the voltage in units of V (volt). As shown in FIG. 7A, node D NODE_D may have an AC voltage level that swings between a ground voltage level (0V) and a predetermined high level voltage level (e.g., 10V). According to one embodiment, when the node D NODE_D has a high level, the first transistor VT1 is turned on and the third switch VT3 is turned off. Further, when the node D NODE_D has a low level, the first transistor VT1 is turned off and the third switch VT3 is turned on.

FIG. 7B shows the voltage level of the first output node NODE_OUT1 of FIG. 6. The horizontal axis of the graph of FIG. 7B represents the time in micro second units, and the vertical axis represents the voltage in kV. As shown in FIG. 7B, the DC current output from the first AC-DC converter 510a may be converted to an AC current by the switching device 100 according to the disclosed embodiments to thereby be converted to the waveform shown in FIG. 7B in the first output node NODE_OUT1. The switching device 100 according to the disclosed embodiments may generate a high-frequency signal having a period of micro second units.

FIG. 7C shows the voltage level of node T NODE_T of FIG. 6. The horizontal axis of the graph of FIG. 7C represents the time in micro second units, and the vertical axis represents the voltage in V units. As shown in FIG. 7C, the AC current output from the inverter 520a may be converted to a low level voltage by the transformer to thereby be converted to the waveform shown in FIG. 7C.

Figure 8:
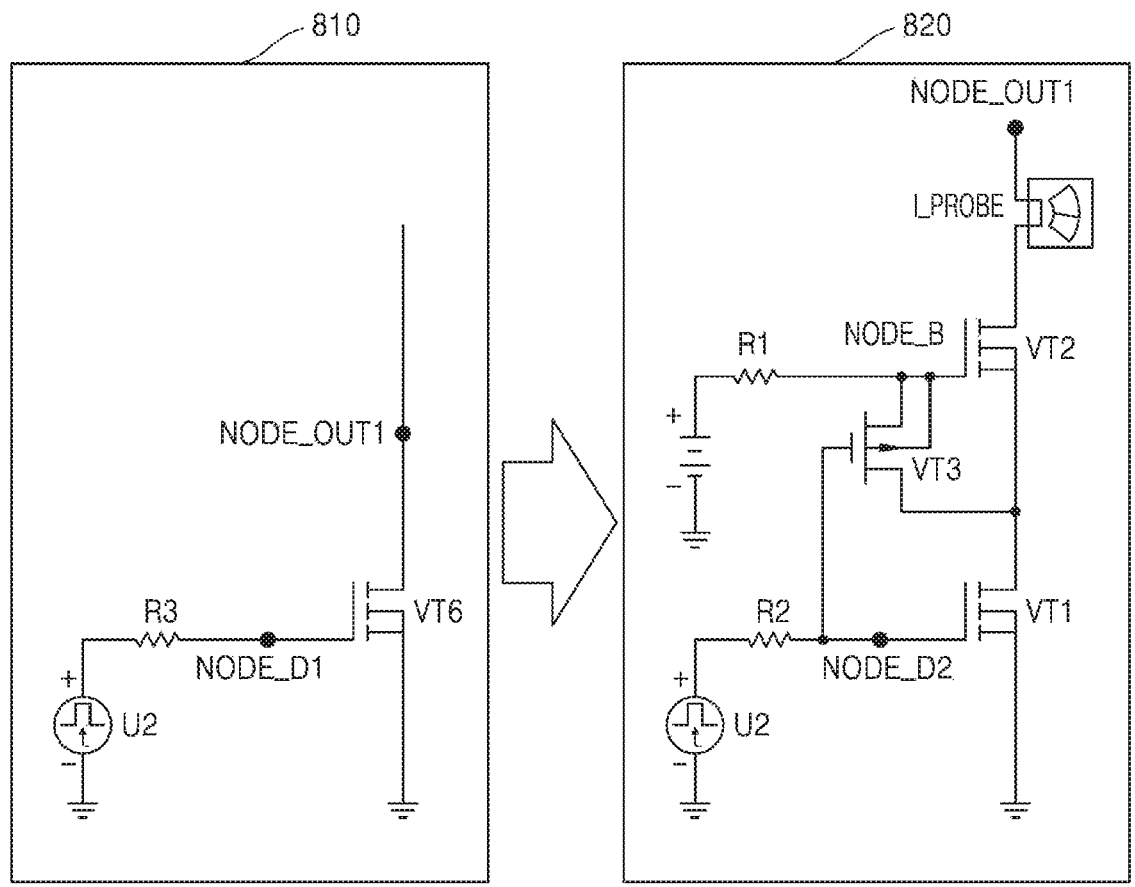
FIG. 8 is a diagram illustrating the structure of a switching device 810 according to a comparative example and a switching device 820 according to an embodiment of the present disclosure.

FIG. 8 is a diagram illustrating the structure of a switching device 810 according to a comparative example and a switching device 820 according to an embodiment of the present disclosure.

The switching device 810 according to the comparative example includes a sixth transistor VT6, a third resistor R3, and a control signal source U2. The sixth transistor VT6 is connected between the first output node NODE_OUT1 and the ground node, and the control terminal is connected to the control signal source U2 through the third resistor R3.

The switching device 820 according to an embodiment of the present disclosure may have the same structure as that of the switching device 100d described above with reference to FIG. 6.

Figure 9:
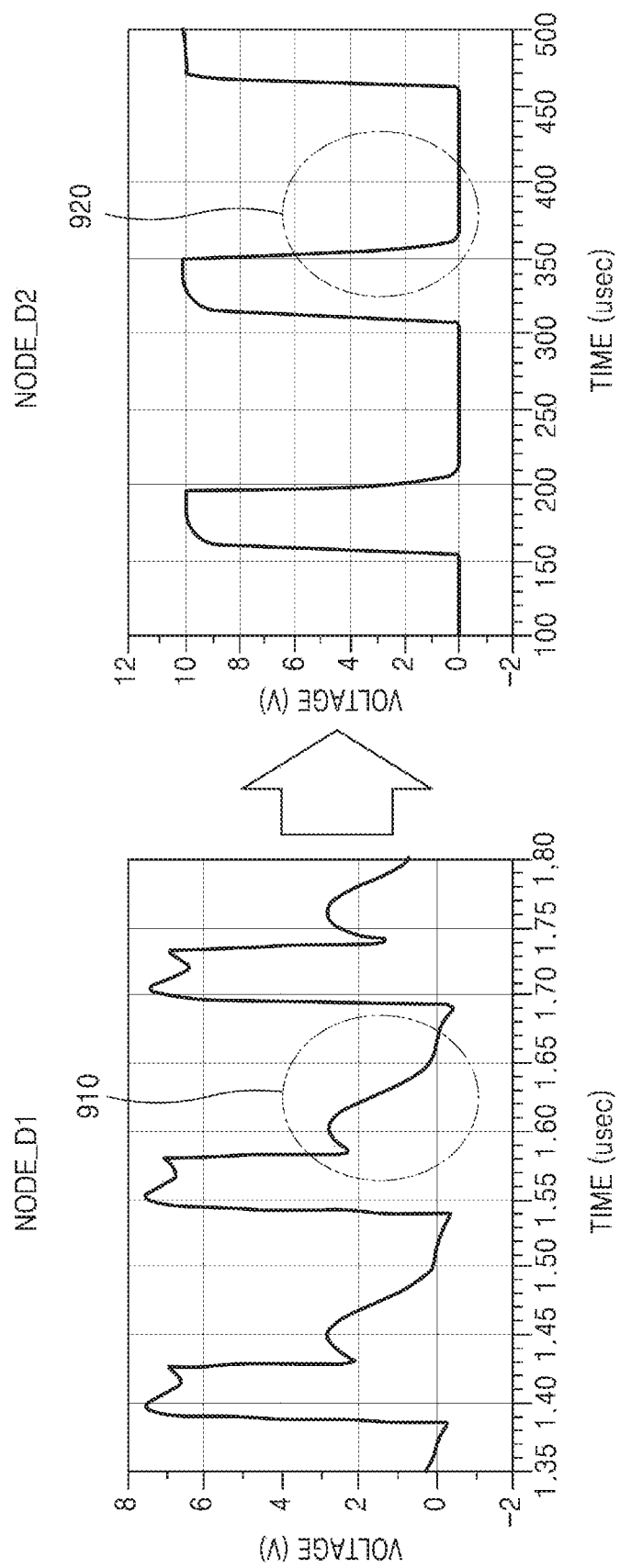
FIG. 9 is a diagram illustrating voltage levels at node D1 NODE_D1 and node D2 NODE_D2 in the comparative example shown in FIG. 8 and in one embodiment of the present disclosure.

FIG. 9 is a diagram illustrating voltage levels at node D1 NODE_D1 and node D2 NODE_D2 in the comparative example shown in FIG. 8 and in one embodiment of the present disclosure.

According to the comparative example, a waveform distortion 910 is observed at the falling edge of the voltage level of the node D1 NODE_D1 connected to the gate terminal of the sixth transistor VT6. Particularly, since the fall of the voltage level is delayed at the falling edge, the power consumption consumed in one period increases. As a result, according to the comparative example, the leakage current of the switching device increases, and the power efficiency is lowered. Leakage currents are dissipated in the form of heat, which increases the heat generation of the device. When the heat generation increases, an additional cooling system is required, which increases the size of the device and raises the unit price. In addition, such a waveform distortion 910 becomes an obstacle in increasing the frequency of the switching device, thereby making it difficult to implement the high-frequency switching device.

On the other hand, according to one embodiment of the present disclosure, little distortion occurs at the falling edge of the voltage level of node D2 NODE_D2 connected to the gate terminal of the first transistor VT1 (920). In particular, the voltage level distortion 910 observed in the comparative example is rarely found in one embodiment of the present disclosure. According to the disclosed embodiments, the distortion is removed at the falling edge of the node D2 NODE_D2 as shown in FIG. 9, thereby reducing the leakage current and increasing the power efficiency. Further, according to the disclosed embodiments, as the switching response speed increases, a high switching speed may be possible and a high-frequency switching device may be provided. Further, the heat generation may be reduced and the cooling load of the cooling system may be reduced by reducing the leakage current, to thereby allowing the size and unit cost of the device to be reduced.

According to the measurement example shown in FIGS. 8 and 9, the efficiency of the switching device according to the embodiments of the present disclosure is equal to or greater than 93%, and the simulation accuracy has a +/−1% error range. According to one embodiment of the present disclosure, the efficiency may increase by about 9%, for example, efficiency may increase from 84% to 93%, when compared to a comparative example (for example, a MOSFET switch structure).

Figure 10B:
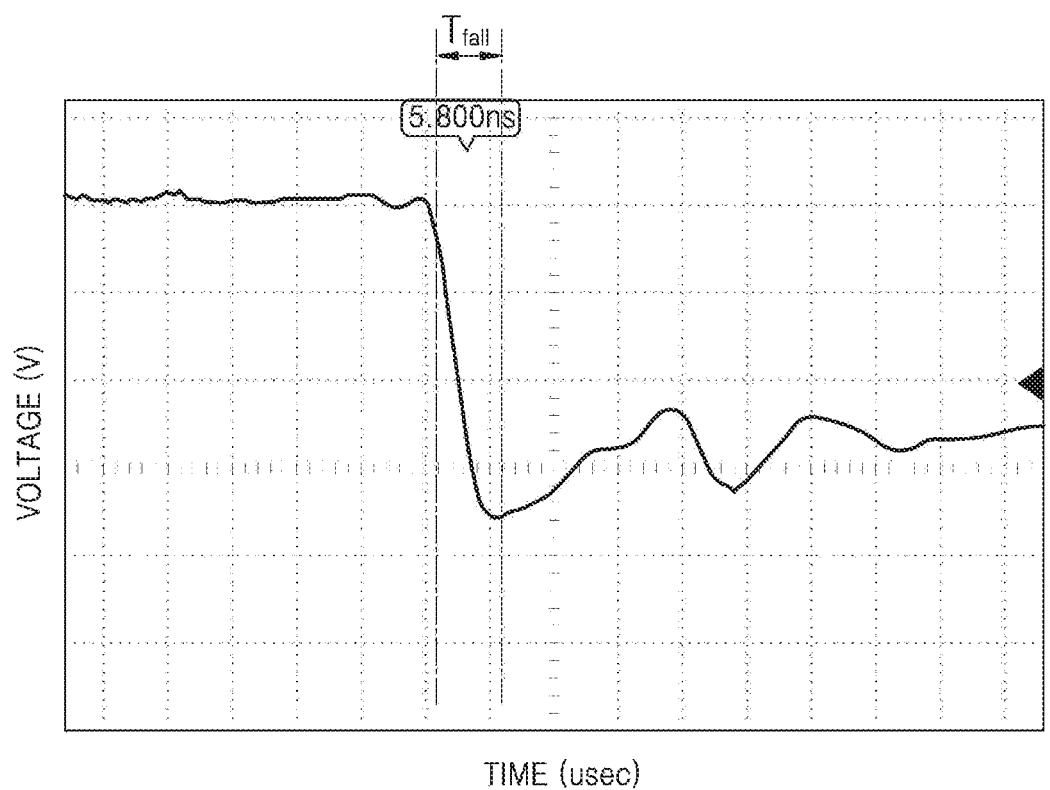
FIGS. 10B, 10C, and 10D are diagrams illustrating voltage level waveforms at control terminals of respective switching device structures.
Figure 10C:
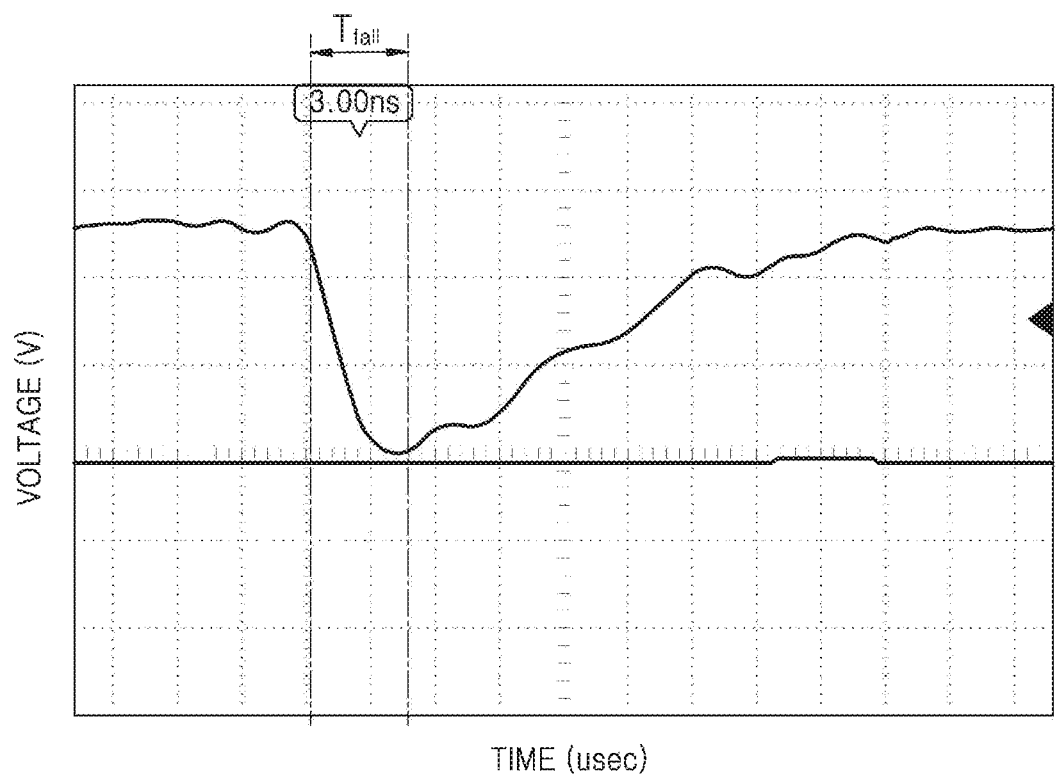
Figure 10D:
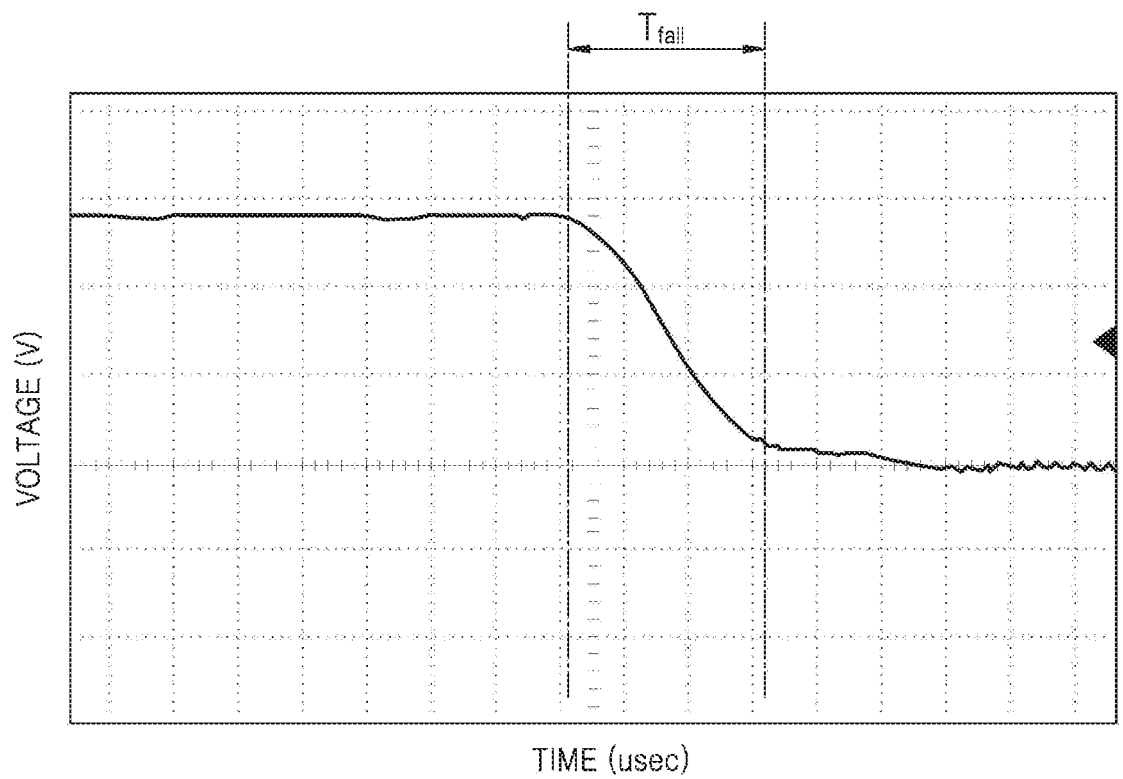

FIG. 10A is a diagram illustrating response time and costs of a switching device according to a comparative example and an embodiment of the present disclosure. FIGS. 10B, 10C, and 10D are diagrams illustrating voltage level waveforms at control terminals of respective switching device structures.

The switching device having GaN EPC2012 common source structure which uses GaN (Gallium Nitride) may have a very fast switching-on time by using GaN and may have a switching response time of about 3.2 nsec. Referring to FIG. 10B, the switching device of the GaN EPC2012 common source structure has a very fast switch reaction time, and little distortion is found in the falling edge interval $T_{fall}$. However, since GaN is a very expensive material, it may increase the unit price of the product and may not be easily applied.

The IRF820 common source structure has the structure of the switching device 810 of the comparative example of FIG. 8, and has a disadvantage that the switching speed is lowered because the switching-on time is the longest as 8.0 nsec as compared with the structures of other switching devices of FIG. 10A. As shown in FIG. 10D, the IRF 820 common source has a relatively long falling edge interval $T_{fall}$. However, since the IRF 820 common source is cheaper than GaN switching device, it may be used to lower the product cost.

A silicon-based switching device (Si IRF 820 common gate+Si D2089UK common source (cascode structure)) according to embodiments of the present disclosure has a short switching-on time of about 4.5 nsec. As shown in FIG. 10C, the silicon-based switching device according to the embodiments of the present disclosure has a relatively short falling edge interval $T_{fall}$, and little distortion is found in the falling edge interval $T_{fall}$. Further, the silicon-based switching device according to the embodiments of the present disclosure has the effect of providing a high-speed switching operation close to an expensive GaN switching device at a relatively low cost by using silicon of a low unit cost.

FIG. 11 is a diagram illustrating an example of calculating the volume of a power conversion device according to an embodiment.

The current source inductor indicates L3 of FIG. 6, the input filter inductor indicates the first inductor L1 of FIG. 6, the power transformer indicates the fourth inductor L4, the fifth inductor L5, and the sixth inductor L6 of FIG. 6, the primary switching circuit indicates the switching device 100d of FIG. 6, and the rectifier circuit indicates the sixth diode D6 and the seventh diode D7 of FIG. 6. In general, since the inductors take up the largest volume in the circuit, the volume of the inductors makes a large contribution to the volume of the power conversion device.

The power conversion device according to an embodiment of the present disclosure may have a power density of about 25 or more, as shown in FIG. 11. According to the embodiments of the present disclosure, the power density of the power conversion device may be increased by reducing the volume of the transformer by the high-voltage high-frequency switching device.

The power conversion device based on the switching device according to the disclosed embodiments may be simulated using the software package Advanced Design System ADS 2011.6 for electrical simulation. Simulation results show that the operating frequency is significantly increased at sufficiently high efficiency (about 85%). According to one experimental example, it is possible to support up to 13.56 MHz by applying one embodiment whereas the switching device has previously supported up to 100-300 kHz. Further, according to the disclosed embodiments, a high direct current voltage (up to 400 V) generated by rectifying the main power voltage of 220 V, 50 or 60 Hz may be input to the inverter including the switching device. According to the simulation results, the output voltage of the inverter has a frequency of 13.56 MHz at a power of 231 W and an efficiency of 84.6% (input power 274 W). At these high operating frequencies, a reactive element (an inductor of about 1.0 μH) with the main reactance of the inverter may be implemented with a volume of only about 10 cm$^3$, which allows a specific capacity of more than 10 W/cm$^3$.

Therefore, according to the disclosed embodiments, a compact, low-loss, high-speed, high-power, high-frequency switching device may be provided.

It is also to be understood that the advantages of embodiments of the present disclosure include not only the general size reduction of the power supply device including the power conversion device using the switching devices according to the disclosed embodiments but also allowing production of such a power supply device in the form of a plane structure with a low height. These advantages have the effect of increasing consumer convenience. For example, the slim structure of the power supply device may reduce the thickness of the TV housing in a TV, thereby increasing consumer convenience.

The disclosed embodiments described have been described above with reference to the accompanying drawings. It will be understood by one of ordinary skill in the art that various changes in form and details may be made therein without departing from the spirit and scope of the disclosure as defined by the appended claims. The disclosed embodiments are illustrative and should not be construed as limiting.

The invention claimed is:

1. A switching device comprising:
a cascode switch comprising at least two transistors connected in series and receiving a switching control signal; and
a third switch receiving the switching control signal,
wherein the at least two transistors comprise a first transistor receiving the switching control signal through a control terminal and a second transistor comprising a control terminal connected to a first voltage source, and
wherein the third switch is connected between the control terminal of the second transistor and a first terminal of the second transistor, is turned off when the first transistor is turned on, and is turned on when the first transistor is turned off.

2. The switching device of claim 1, wherein the cascode switch is connected between a ground node and an output node, a first terminal of the first transistor is connected to the ground node, and a second terminal of the second transistor is connected to the output node.

3. The switching device of claim 1, wherein each of the first transistor, the second transistor, and the third switch is a Metal Oxide Silicon Field Effect Transistor (MOSFET),
wherein the control terminal of the first transistor, the second transistor, and the third switch is a gate of the MOSFET, and
wherein the first terminal of the second transistor is a source of the MOSFET.

4. The switching device of claim 3, wherein each of the first transistor and the second transistor is an N-type MOSFET, and the third switch is a P-type MOSFET.

5. The switching device of claim 1, wherein each of the first transistor, the second transistor, and the third switch is a bipolar transistor, the control terminal of the first transistor and the second transistor is a base, and the first terminal of the second transistor is an emitter.

6. The switching device of claim 1, wherein each of the first transistor and the second transistor are an npn transistor, and the third switch is a pnp transistor.

7. The switching device of claim 1, wherein the cascode switch comprises at least one transistor connected between a second terminal of the first transistor and the first terminal of the second transistor.

8. The switching device of claim 1, wherein a power capacity of the second transistor is greater than that of the first transistor, and
wherein a power capacity of the third switch is smaller than that of the second transistor.

9. The switching device of claim 1, further comprising: a first diode comprising a cathode connected to the control terminal of the second transistor and an anode connected to a second terminal of the second transistor, and being connected with the third switch in parallel between the control terminal and the second terminal of the second transistor.

10. The switching device of claim 1, wherein the switching control signal is an alternating current (AC) signal and an output node outputs an AC current synchronized with a frequency of the switching control signal.

11. The switching device of claim 1, wherein the first voltage source is a direct current (DC) voltage source having a voltage level lower than a high level voltage of an output node.

12. The switching device of claim 1, wherein the switching control signal has a frequency between 50 MHz and 60 MHz.

13. A power conversion device comprising the switching device according to claim 1.

14. The power conversion device of claim 13, wherein the power conversion device comprises:
a first AC-DC converter configured to receive a first AC current and convert the first AC current into a first DC current having a first voltage level;
an inverter configured to convert the first DC current output from the first AC-DC converter into a second AC current of a first frequency;
a transformer configured to convert the second AC current output from the inverter into a third AC current having a second voltage level and outputting the third AC current; and
a second AC-DC converter configured to convert the third AC current output from the transformer into a second DC current having a rated output voltage level,
wherein the inverter comprises the switching device and the switching device receives the switching control signal of the first frequency.

15. The power conversion device of claim 14, wherein the first DC current output from the first AC-DC converter has a voltage level higher than that of the first AC current.

* * * * *